United States Patent
Taniguchi et al.

(10) Patent No.: US 6,856,653 B1
(45) Date of Patent: Feb. 15, 2005

(54) DIGITAL SIGNAL SUB-BAND SEPARATING/COMBINING APPARATUS ACHIEVING BAND-SEPARATION AND BAND-COMBINING FILTERING PROCESSING WITH REDUCED AMOUNT OF GROUP DELAY

(75) Inventors: Shohei Taniguchi, Yokohama (JP); Masayuki Ito, Yokohama (JP); Yutaka Banba, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 586 days.

(21) Appl. No.: 09/662,823

(22) Filed: Sep. 15, 2000

(30) Foreign Application Priority Data

Nov. 26, 1999 (JP) ........................................... 11-336698

(51) Int. Cl.[7] .............................................. H04B 15/00
(52) U.S. Cl. ........................ 375/285; 375/349; 375/350; 379/3; 379/406.01
(58) Field of Search ................................ 375/242, 254, 375/260, 285, 296, 346, 349, 350; 708/300; 379/3, 67.1, 406.01, 406.08, 406.14

(56) References Cited

U.S. PATENT DOCUMENTS

| | | | | |
|---|---|---|---|---|
| 4,048,443 A | * | 9/1977 | Crochiere et al. | 704/206 |
| 4,815,023 A | * | 3/1989 | Arbeiter | 708/301 |
| 5,436,940 A | * | 7/1995 | Nguyen | 375/240 |
| 5,610,944 A | * | 3/1997 | Mau et al. | 375/260 |
| 5,802,481 A | * | 9/1998 | Prieto | 702/190 |
| 5,974,181 A | * | 10/1999 | Prieto | 382/232 |
| 6,249,395 B1 | * | 6/2001 | Conway | 360/51 |
| 6,426,983 B1 | * | 7/2002 | Rakib et al. | 375/346 |
| 6,532,256 B2 | * | 3/2003 | Miller | 375/222 |

FOREIGN PATENT DOCUMENTS

| | | |
|---|---|---|
| JP | 60-197009 | 10/1985 |
| JP | 7-297726 | 11/1995 |
| JP | 9-139653 | 5/1997 |

* cited by examiner

*Primary Examiner*—Jean B. Corrielus
(74) *Attorney, Agent, or Firm*—McDermott Will & Emery LLP

(57) ABSTRACT

An apparatus having a band-separating filter bank for separating a digital signal into a plurality of sub-band signals, to be processed or transmitted, and a band-combining filter bank for subsequently combining the resultant sub-band signals into a single digital signal, wherein each of the band-separating filter bank and band-combining filter bank incorporates a FIR low pass filter having an asymmetric impulse response, as the prototype filter of the filter bank. A significant reduction can thereby be achieved in the amount of overall group delay that results from the processing performed by these filter banks.

2 Claims, 9 Drawing Sheets

PRIOR ART

> US 6,856,653 B1

DIGITAL SIGNAL SUB-BAND SEPARATING/COMBINING APPARATUS ACHIEVING BAND-SEPARATION AND BAND-COMBINING FILTERING PROCESSING WITH REDUCED AMOUNT OF GROUP DELAY

BACKGROUND OF THE INVENTION

1. Field of the Invention

The invention relates to a sub-band separating/combining apparatus having a band-separating filter bank for converting a digital signal to a plurality of sub-band signals and a band-combining filter bank which receives the sub-band signals after processing or transmission thereof, for combining these to recover the original digital signal or a processed version of that signal

2. Description of the Related Art

There are various applications in which a digital signal is supplied to a set of filters of a band-separating filter bank (sometimes referred to as an analyzing filter bank) to be spectrally divided into a plurality of sub-band signals, i.e., respectively corresponding to different frequency bands, with the sample rate of each of the sub-band signals then being reduced by decimation (i.e., down-sampling). Processing or transmission of the resultant low-bandwidth sub-band signals can then be efficiently performed. After processing or transmission of the sub-band signals, they are supplied to a band-combining filter bank (sometimes referred to as a synthesizing or a reconstructing filter bank), to be each subjected to interpolation processing (i.e., up-sampling), then inputted to respective ones of a set of filters whose outputs are additively combined to recover the original digital signal (or a processed version of that signal).

A prior art example of such a combination of a band-separating filter bank and a band-combining filter bank is shown in FIG. 7. Here, a band-separating filter bank 701, a processing section 703 and a band-combining filter bank 702 successively operate on an input digital signal designated as x(n). The processing section 703 may for example perform such operations as data encoding/decoding, echo cancellation processing, etc.

The band-separating filter bank 701 divides the input digital signal x(n) into a total of M channels of sub-band signals, whose respective frequency bands will be numbered as bands 0 to (M−1) respectively. 710~71n designate the respective band-separating filters of the filter bank 701, respectively corresponding to frequency bands 0 to (M−1), with their respective Z-transform transfer functions (referred to in the following simply as transfer functions) designated as $G_0(z)$~$G_{M-1}(z)$. The output sub-band signals from these filters 710~71n are supplied to respective ones of a set of decimators 720~72n, with the resultant down-sampled sub-band signals being supplied to the processing section 703. The band-combining filter bank 702 includes a set interpolators 740~74n which respectively receive the processed sub-band signals produced from the processing section 703, while 730~73n are band-combining filters respectively corresponding to the frequency bands 0~M−1 and having respective transfer functions $K_0(z)$~$K_{M-1}(z)$, which receive the corresponding ones of the interpolated sub-band signals which are produced from the interpolators 740~74n.

The decimation and interpolation factor is indicated as D. That is to say, one in every D samples of a sub-band signal is selected by the decimation processing, while (D−1) fixed sample values (e.g., zero values) are inserted following each sample of a processed sub-band signal, by the interpolation processing.

It will be assumed that the number M of sub-bands into which the input digital signal is divided is identical to the aforementioned decimation and interpolation factor D.

The output sub-band signals from the filters 730~73n are additively combined in an adder 704, to obtain a digital signal y(n) as the output signal.

This is a recovered version of the original digital signal (possibly modified as a result of the operation of the processing section 703). If it is assumed that the processing 703 section performs a type of processing such as echo cancellation, which requires the use of DFT filter banks for band separation and combining, then the respective transfer functions $G_k(z)$ and $K_k(z)$ of the k-th band-separating filter and k-th band-combining filter are expressed as follows by equations (1) and (2) respectively:

$$G_k(z) = G_0(zW_M^k) \tag{1}$$

$$K_k(z) = W_M^{-k} K_0(zW_M^k) \tag{2}$$

Here, $W_M^k = \exp(-j2\pi k/M)$, with $0 < k < M-1$, and each of $G_0(z)$ and $K_0(z)$ represents the transfer function of the prototype filter of a DFT (Discrete Fourier Transform) filter bank. The term "prototype filter" as used herein in relation to a band-separating filter bank or band-combining filter bank signifies a low-pass filter which handles the lowest frequency band, such as filter 710 of the band-separating filter bank 701 in FIG. 7.

If however the processing section 703 performs processing which requires the use of cosine modulation filter banks as the band-separating filter bank and band-combining filter bank, then the respective transfer functions of the k-th band-separating filter and k-th band-combining filter are obtained as follows from equations (3) and (4) respectively:

$$G_k(z) = a_k{}^* c_k P(zW_{2M}{}^{(k+1/2)}) + a_k{}^* c_k{}^* P(zW_{2M}{}^{-(k+1/2)}) \tag{3}$$

$$K_k(z) = a_k{}^* c_k P(zW_{2M}{}^{(k+1/2)}) + a_k{}^* c_k{}^* P(zW_{2M}{}^{-(k+1/2)}) \tag{4}$$

Where $W_{2M} = \exp(-j\pi/M)$, with $0 < k < M-1$, $a_k = \exp(j\theta_k)$, $C_k = W_{2M}{}^{(k+1/2)(N-1)/2}$, $\theta_k = (2k+1)\pi/4$, N is the number of taps of the prototype filter, the * symbol indicates the complex conjugate, and P(z) designates the transfer function of the prototype filter of a cosine modulation filter bank.

In the prior art, a FIR low-pass filter having a symmetric impulse response is used as the prototype filter in such a type of filter bank. An example of such a symmetric impulse response is shown in FIG. 8.

However with such a prior art type of apparatus which uses a filter in which each of the prototype filters of the sub-band separating filter bank and sub-band combining filter bank is a FIR (finite impulse response) low-pass filter having a symmetric impulse response, designating the number of taps of such a prototype filter as N, an amount of delay will be produced by the operation of a filter bank that is equal to the total of the group delays of (N−1) taps. In many applications, such an amount of delay becomes a serious disadvantage. For example, if the processing section 703 in FIG. 7 performs echo canceller processing, then it is essential to minimize the sub-band separating and sub-band combining filter delays, in order to achieve a suitably high speed of control response together with stability of operation.

SUMMARY OF THE INVENTION

It is an objective of the present invention to overcome the above problem by providing an improved sub-band separating apparatus and sub-band combining apparatus, each apparatus having at least one band-separating filter bank and at least one band-combining filter bank, wherein an amount of delay which results from filtering performed successively by said filter banks is reduced, by comparison with prior art types of filter bank utilized for a sub-band separating and combining apparatus.

To achieve the above objective, the invention provides a sub-band separating apparatus and sub-band combining apparatus wherein each of respective basic filters of a band-separating filter bank and a band-combining filter bank is configured to have a symmetric impulse response, to thereby achieve a lower amount of group delay for each prototype filter and thereby reduce an overall amount of delay which results from filtering by the filter banks.

The invention further provides a digital signal encoder apparatus comprising sub-band separating means for converting an input digital signal to a plurality of sub-band signals and encoding means for respectively encoding said sub-band signals and combining resultant encoded data into a data stream to be transmitted or processed, in which the sub-band separating means consists of a low-delay sub-band separating apparatus as described above, and similarly provides a corresponding decoder apparatus which utilizes a low-delay sub-band combining apparatus as described above.

The invention moreover enables such an encoder apparatus and decoder apparatus to each perform efficiently by providing a high-speed algorithm which utilizes the periodicity of a cosine function to minimize an amount of processing which is required to implement the respective functions of the various band-pass filters of such an apparatus.

Such an encoder apparatus and decoder apparatus are particularly suitable for use in compression encoding and subsequent expansion decoding of a PCM digital audio signal.

The invention further enables an improved digital wireless microphone system to be configured, in which a digital audio signal which is to be transmitted by radio as a data stream is compression-encoded by an encoding apparatus utilizing a low-delay sub-band separating apparatus and is subsequently decoded upon reception, by using a decoding apparatus similarly utilizing a low-delay sub-band combining apparatus according to the invention.

The apparatus moreover provides an echo canceller apparatus in which a digital audio signal received from a remote location to be audibly reproduced by a loudspeaker is subjected to sub-band separation and then adaptive filtering of the respective sub-band signals, a digital audio signal obtained from a microphone which may be adjacent to the loudspeaker is also converted to a set of sub-band signals, the differences between these signals and the adaptively filtered sub-band signals are obtained as respective error signals and applied to update the coefficients of the adaptive filters, and are also subjected to band-combining filter processing to obtain an output digital signal that is returned to the remote location, in which the sub-band separating and sub-band combining processing are performed using low-delay sub-band separating apparatuses and a low-delay sub-band combining apparatus according to the invention. As a result, due to the reduced amounts of filter delay, more effective suppression can be achieved of a signal that is returned to the remote location as an echo.

DESCRIPTION OF PREFERRED EMBODIMENTS

First Embodiment

Figure 1:
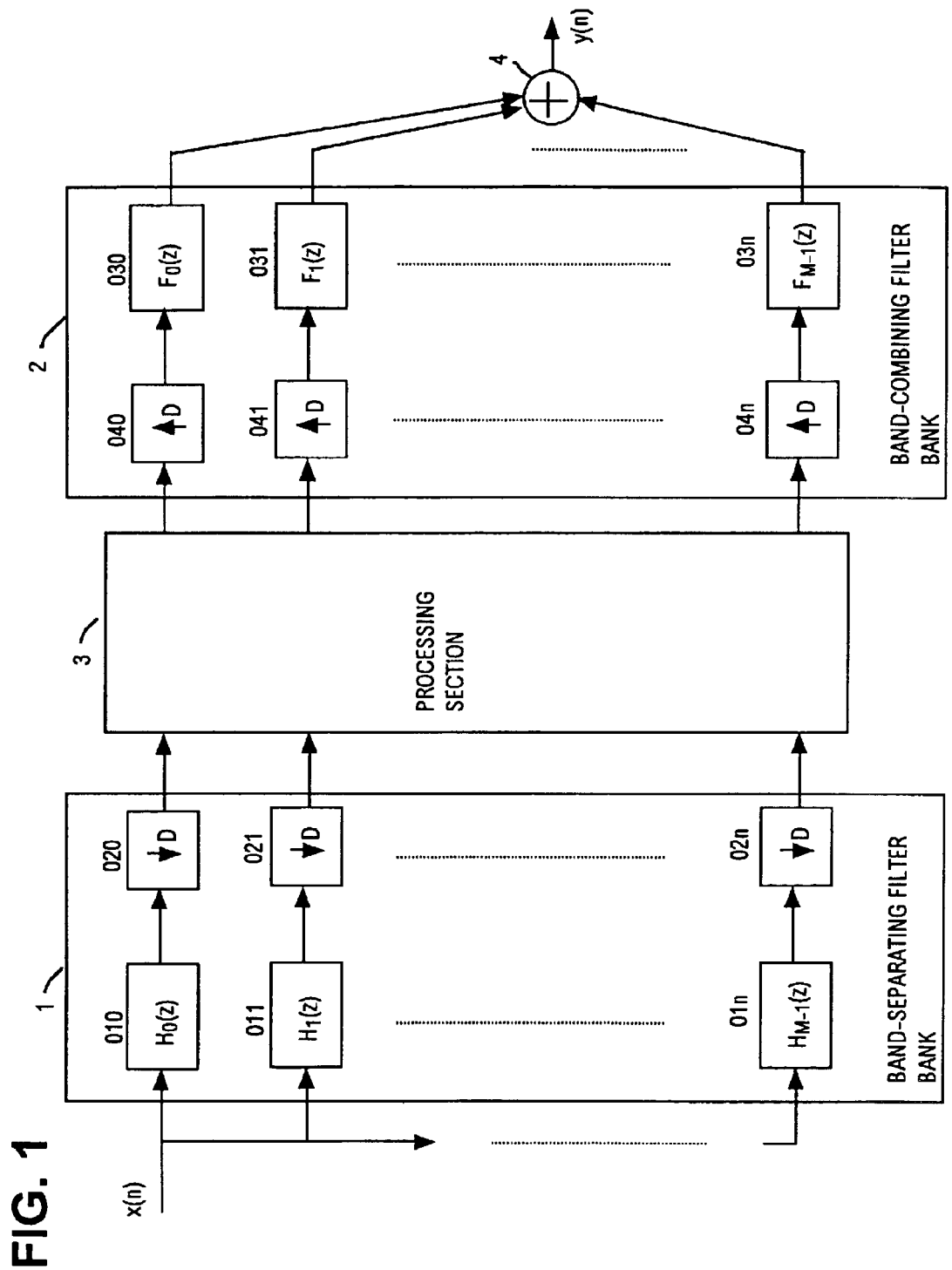
FIG. 1 is a general system block diagram of a digital signal sub-band separating apparatus and sub-band combining apparatus according to a first embodiment of the invention.

FIG. 1 is a general system block diagram of a first embodiment of the invention, which is a combination of a sub-band separating apparatus and a sub-band combining apparatus, for use with a processing (or transmitting/receiving) system. In FIG. 1, a band-separating filter bank 1 performs filtering of respective frequency bands of an input PCM digital signal x(n), then decimation is applied, using a decimation factor of D. The band-separating filter bank 1 is formed of a set of band-separating filters 010~01n and a corresponding set of down-samplers 020~02n, each of which applies decimation by a fixed factor D (i.e., selecting one in every D successive samples) to the output sub-band signal from the corresponding one of the band-separating filters 010~01n. After the resultant decimated sub-band signals have been subjected to predetermined processing in a processing section 3, they are inputted to a band-combining filter bank 2, which effects interpolation of the signals, i.e., by inserting (D−1) interpolation values for each value of an input signal, and filtering of the resultant interpolated sub-band signals by respective filters. The resultant filtered interpolated sub-band signals are then additively combined by an adder 4, to recover the original PCM digital signal y(n) or a processed version of that signal.

The band-combining filter bank 2 is formed of a set of up-samplers 040~04n which receive and apply interpolation by the aforementioned factor D to respectively corresponding ones of the sub-band signals which are outputted from the processing section 3, and a set of band-combining filters 030~03n respectively corresponding to the frequency bands of the sub-band signals, which receive and filter respectively corresponding ones of the interpolated sub-band signals which are outputted from the up-samplers 04₀~04n, with the resultant sub-band signals being supplied to the adder 4.

If the processing section 3 performs a type of processing such as echo cancellation, for which each of the band-separating filter bank 1 and band-combining filter bank 2 should be DFT filter banks, then the respective transfer functions of the k-th band-separating filter of filter bank 1 and the k-th band-combining filter of the filter bank 2 are expressed as follows by equations (5) and (6) respectively:

$$H_k(z) = H_0(z W_M^k) \quad (5)$$

$$F_k(z) = W_M^{-k} F_0(z W_M^k) \quad (6)$$

Where $W_M^k = \exp(-j2\pi k/M)$, with $0 < k < M-1$

In equations (5), (6), $H_0(z)$ and $F_0(z)$ respectively express the transfer functions of the prototype filters 01₀, 03₀ respectively of the band-separating filter bank 1 and band-combining filter bank 2 of this embodiment, for the case in which each of these is a DFT filter bank.

If the processing section 3 on the other hand performs a type of processing which requires that each of the band-separating filter bank 1 and band-combining filter bank 2 be a cosine modulation filter bank, then transfer functions of the k-th band-separating filter of filter bank 1 and the k-th band-combining filter of the filter bank 2 are expressed as follows by equations (7) and (8) respectively:

$$H_k(z) = e^{j\phi_k} P(W_{2M}(W_{2M}^{(k+1/2)}z)) + e^{-j\phi_k} P(W_{2M}^{(k-1/2)}z) \quad (8)$$

$$F_k(z) = e^{j\Psi_k} P(W_{2M}^{(k+1/2)}z) + e^{-j\Psi_k} P(W_{2M}^{(k-1/2)}z) \quad (8)$$

where $0 < k < M-1$, and where, designating the group delay of the prototype filter as $k_d$, the following relationships are true:

$$\phi_k(z) = (M - k_d)(2k+1)\pi/(4M)$$

$$\Psi_k(z) = (-M - k_d)(2k+1)\pi/(4M)$$

In equations (7) and (8), P(z) expresses the transfer function of the prototype filter of a cosine modulation filter bank, i.e., in this case, the transfer function of each of the prototype filters 01₀ and 03₀ of the band-separating filter bank 1 and band-combining filter bank 2 respectively.

For encoding efficiency, the decimation/interpolation factor D is preferably made equal to the separation factor M, i.e., made equal to the number of sub-band signal channels.

Figure 2:
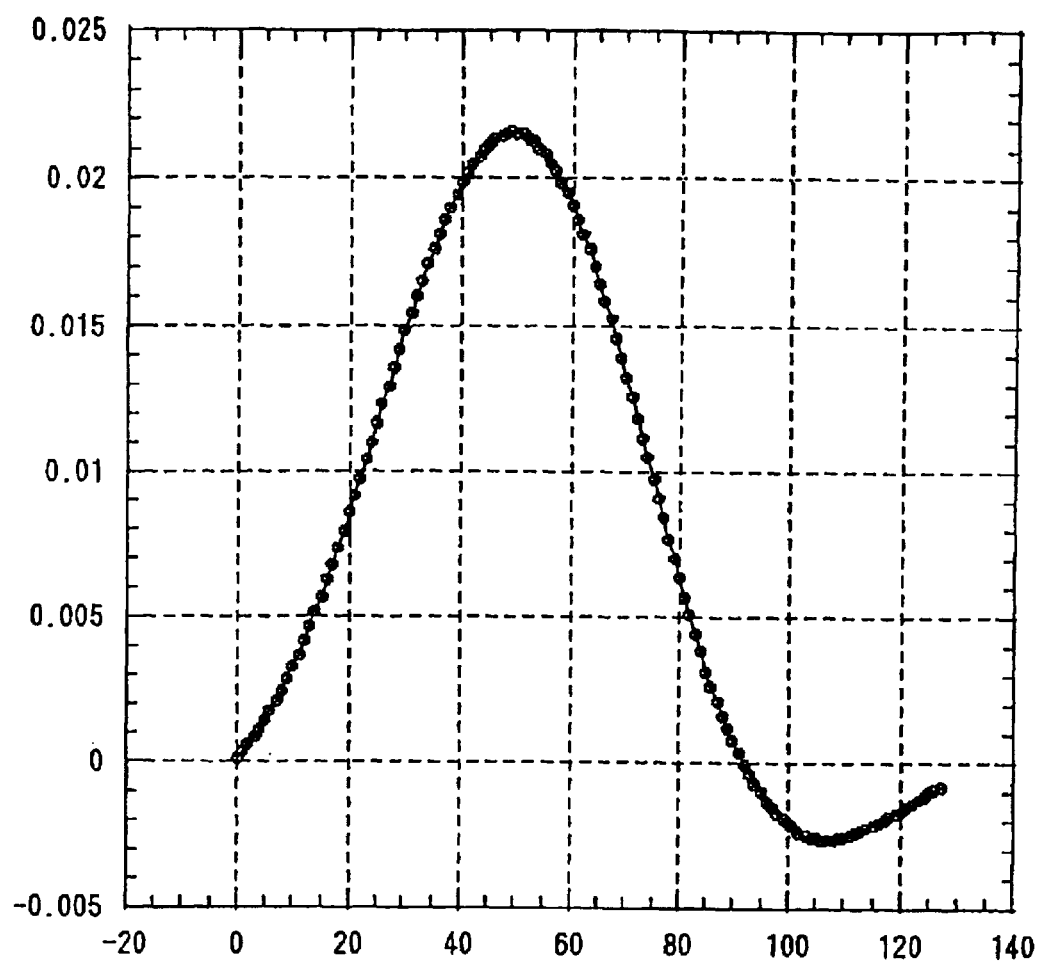
FIG. 2 is a graph illustrating an asymmetric impulse response of a FIR filter.

FIG. 2 shows an example of the impulse response of each of the prototype filters 01₀, 03₀ of this embodiment. As shown, this is an asymmetric impulse response, as opposed to the symmetric impulse response shown in FIG. 8.

The operation of the sub-band separating/combining apparatus having the configuration set out above will be described referring to FIG. 1. The input PCM digital signal x(n) is supplied to the band-separating filter bank 1, to be subjected to convolution processing in respective frequency bands by the band-separating filters 01₀~01n, to be thereby separated into respective sub-band signals which are outputted from these filters.

Each of these sub-band signals is then subjected to decimation by the factor D (i.e., through extraction of one out of every D successive samples of a sub-band signal) by the corresponding one of the down-samplers 02₀~02n. The resultant decimated sub-band signals are then subjected to some form of signal processing by the processing section 3, where the term "processing" is to be interpreted as having a broad significance which can for example include encoding a signal for transmission or storage, followed by decoding upon reception or read-out.

The resultant processed sub-band signals which are produced from the processing section 3 are supplied to respectively corresponding ones of the up-samplers 04₀~04n in the band-combining filter bank 2, and each of the resultant interpolated sub-band signals is then subjected to convolution by the corresponding one of the band-combining filters 03₀~03n. The resultant filtered sub-band signals are then additively combined by the adder 4, to obtain as output a recovered PCM digital signal, i.e., in general, a modified version of the original PCM digital signal x(n), as determined by the processing applied by the processing section 3.

Figure 3A:
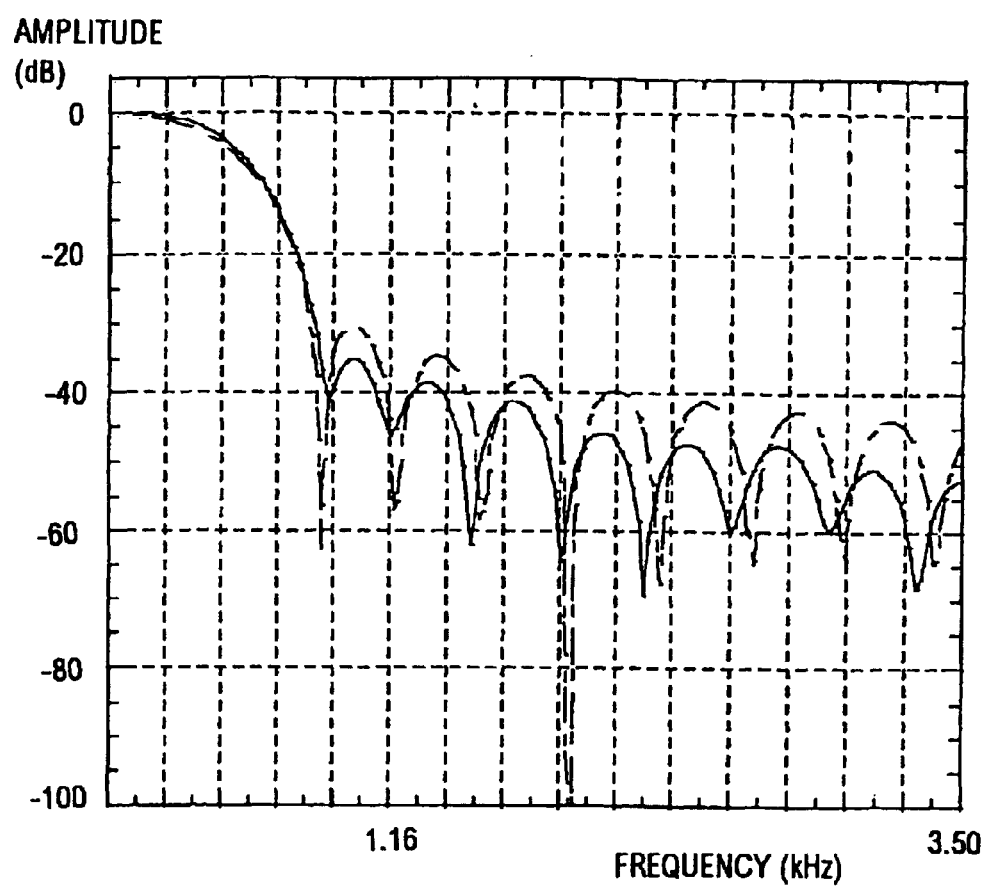
FIG. 3A is a graph for comparing respective amplitude/frequency characteristics of a conventional type of FIR low pass filter and of a FIR low pass filter having an asymmetric impulse response.

FIG. 3A shows a comparison between the amplitude/frequency response of a prototype filter (i.e., a FIR low pass filter) having an asymmetric impulse response as utilized with the present invention, as indicated by the full-line curve, and a prototype filter having a symmetric impulse response as used in the prior art, as indicated by the broken-line curve. Both of the filters are formed with 128 taps, and differ only with respect to the impulse response.

Figure 3B:
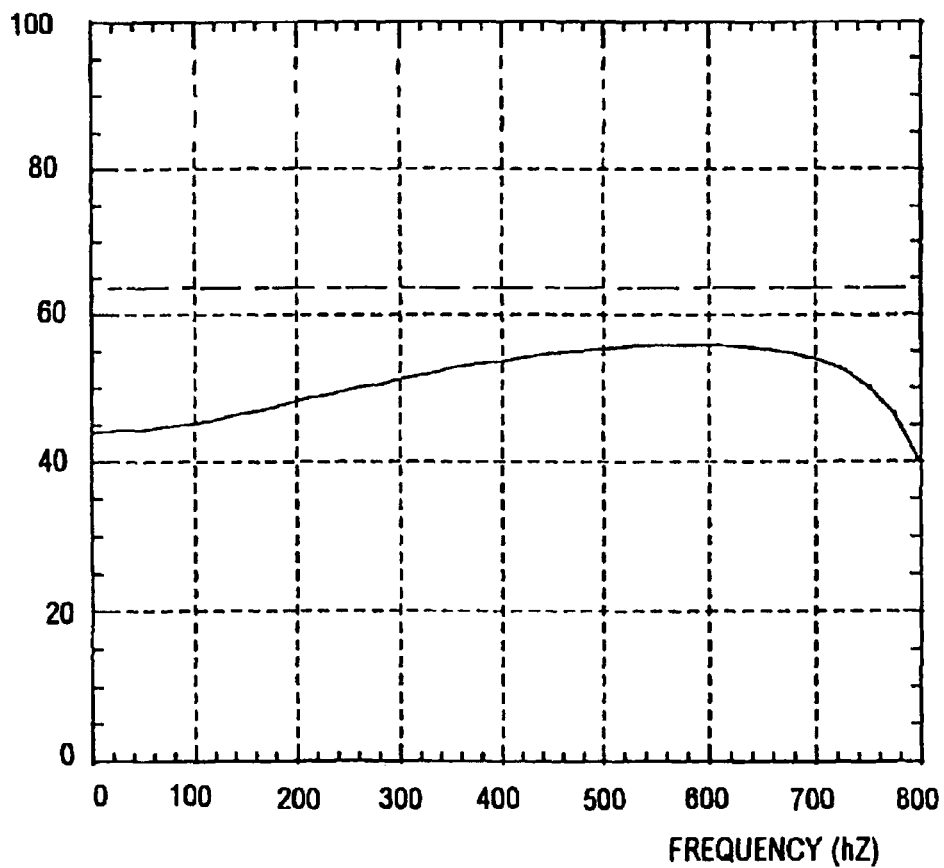
FIG. 3B is a graph for comparing respective group delay/frequency characteristics of a conventional type of FIR low pass filter and of a FIR low pass filter having an asymmetric impulse response.
Figure 8:
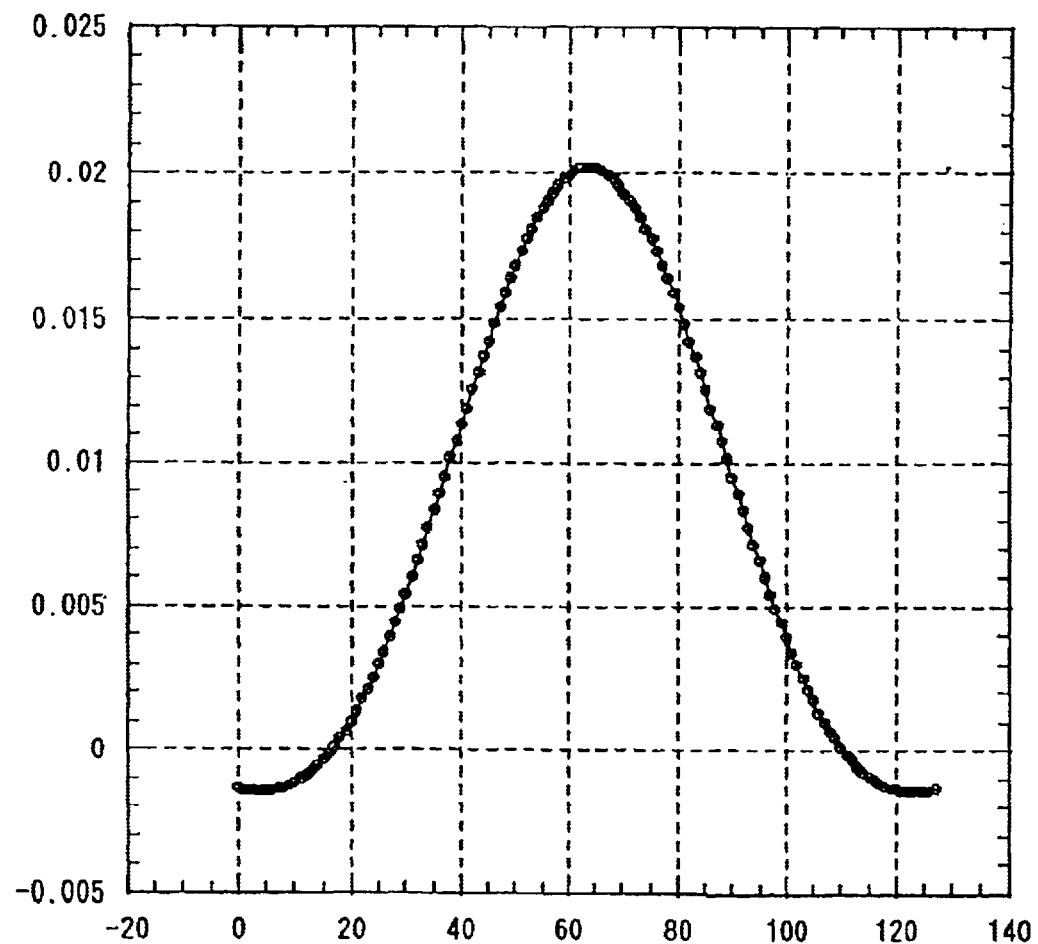
FIG. 8 is a graph illustrating a symmetric impulse response of a FIR filter as used in the apparatus of FIG. 7.

FIG. 3B shows a comparison between the group delay/frequency characteristic of a digital signal sub-band separating/combining apparatus such as that of FIG. 1 (i.e., with respect to the total amount of group delay which occurs from input to a sub-band separating filter bank to output from a sub-band combining filter bank, and results only from the effects of these filter banks), for the case in which both of the filter banks utilizes a prototype filter having an asymmetric impulse response as illustrated in FIG. 2, in accordance with the present invention, with that delay/frequency characteristic being shown as a full-line curve, and for the case in which the filter banks each utilize a prototype filter having a symmetric impulse response, as illustrated in FIG. 8, with that delay/frequency characteristic being shown as a broken-line curve.

As is clear from FIG. 3A, with this embodiment of the invention, the attenuation/frequency characteristic of the prototype filter is closely similar to that of prior art type of filter used as a prototype filter of a digital signal sub-band separating/combining apparatus. However as can be seen from FIG. 3B, a significant improvement is obtained with regard to reducing the amount of group delay which is incurred in the separating/combining processing.

Thus with this embodiment of the invention, by using a FIR low-pass filter having an asymmetric impulse response as each of the respective prototype filters of a band-separating filter bank and band-combining filter bank of a digital signal sub-band separating/combining apparatus, the amount of overall delay which results from transfer of a digital signal through such an apparatus can be substantially reduced, without causing significant deterioration of the attenuation/frequency characteristic of the apparatus.

Second Embodiment

Figure 4:
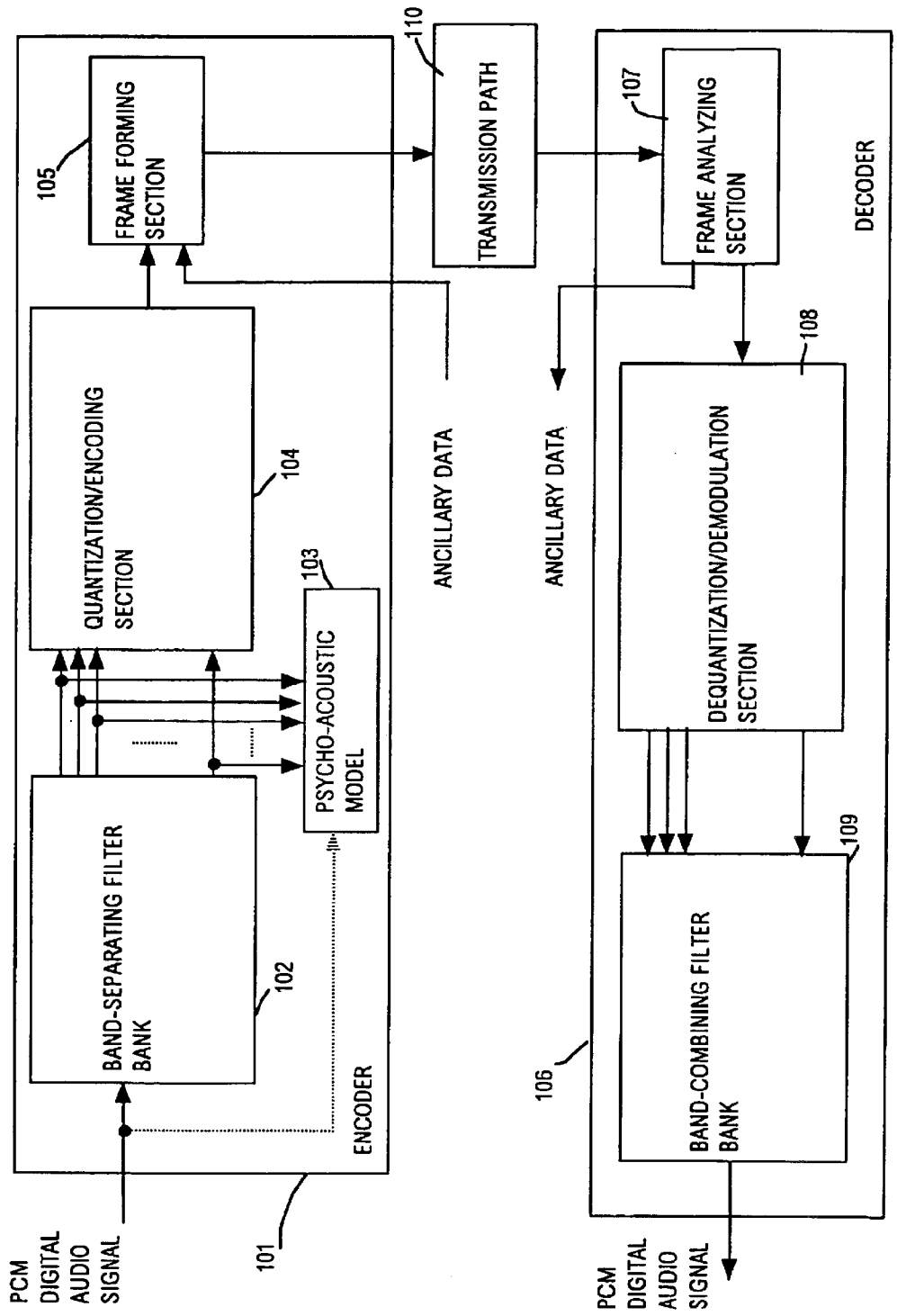
FIG. 4 is a general system block diagram of an embodiment of a PCM digital audio signal encoder apparatus and decoder apparatus, utilizing a sub-band separating apparatus and sub-band combining apparatus according to the invention, for use in transmitting or storing digital audio signal data in compressed encoded form.

FIG. 4 shows a second embodiment of the invention, which is a PCM digital audio signal compression encoding/decoding apparatus. It should be understood that the invention could of course be applied to various other types of digital signal encoding apparatus. In FIG. 4, an encoder 101 receives as input a PCM digital audio signal, performs sub-band separating processing, and uses human psycho-acoustic response characteristics etc., to perform compression encoding processing. The encoder 101 is formed of a band-separating filter bank 102, psycho-acoustic model section 103, quantization/encoding section 104 and frame forming section 105.

The band-separating filter bank 102 is formed as described hereinabove for the band-separating filter bank 1 of the first embodiment, for the case in which this is a cosine modulation filter bank in which the band-separating filters are configured in accordance with equation (7) above, with a decimation factor D that is identical to the separation factor (i.e., is equal to the number of sub-band signal channels.

The bit stream that is produced from the encoder 101 is inputted to the demodulator 106, in which the original sub-band signals are subjected to dequantization and sub-band combining processing in accordance with the frame information, to thereby recover the original PCM digital audio signal. The demodulator 106 is formed of a frame analyzing section 107, a dequantization/decoding section 108 and a band-combining filter bank 109.

The band-combining filter bank 109 is formed as described hereinabove for the band-separating filter bank 1 of the first embodiment, for the case in which this is a cosine modulation filter bank in which the band-separating filters are configured in accordance with equation (8) above, with a decimation factor D that is identical to the number M of sub-band signal channels.

The operation of the encoder 101 and demodulator 106 will be described referring to FIG. 4. Firstly, a PCM digital audio signal is inputted to the encoder 101, and is converted to D channels of sub-band signals (i.e., respective sequences of decimated samples) by the band-separating filter bank 102 as described hereinabove for the first embodiment.

These sub-band signals are inputted to the quantization/encoding section 104 and the psycho-acoustic model section 103, to be processed in parallel by these. In the psycho-acoustic model section 103, the input PCM digital audio signal is subjected to frequency analysis by a method such as FFT processing, etc., to calculate scale factor information from the sub-band signals and to calculate a masking level for the quantization error based on a psycho-acoustic model of human auditory characteristics. Bit allocation information is thereby calculated for each of the frequency bands respectively corresponding to the sub-band signals. However it should be noted that it would be equally possible to calculate only the bit allocation information at this time, without performing FFT processing.

In the quantization/encoding section 104, quantization and encoding are performed in accordance with the bit allocation information which is calculated by the psycho-acoustic model section 103, and the resultant encoded data are combined with externally supplied ancillary data in the frame forming section 105, to obtain successive data frames which are outputted from the encoder 101.

These data frames are then transmitted via a transmission path 110 to be inputted to the demodulator 106. In the demodulator 106, the frame analyzing section 107 first performs frame analysis to separate out the ancillary data of the frames, and also separates the bit allocation information and the sub-band sample information for the respective sub-bands, from the side information which has been transmitted within the frames. The dequantization/decoding section 108 then recovers the original set of sub-band signals, and these are inputted to the band-combining filter bank 109. Here, filtering and interpolation of samples are applied to the respective sub-band signals, and additive combining of the resultant sub-band signals, are performed as described hereinabove for the band-combining filter bank 2 of the first embodiment, to recover the original PCM digital audio signal.

With this embodiment of the invention, in which the band-separating filter bank 102 and band-combining filter bank 109 each achieve a low amount of group delay, a PCM digital signal compression encoding/decoding apparatus can be realized which has a reduced amount of overall system delay.

In the above description, an example is given in which low-delay sub-band separating/combining is performed in the case of PCM digital audio signal compression encoding/decoding. However it would be equally possible to apply the principles described above to a quantization algorithm for modifying images, i.e., to compression encoding and decoding of a digital video signal.

Furthermore the invention could be applied to achieve a higher speed of processing for the band-separating and band-combining operations by making the number of taps of each prototype filter twice the separation factor M, i.e., 2M and by converting each of the above equations (5), (6) to the time domain, and making use of the fact that a cosine function within each of the converted equations periodically takes the values 1 and −1 for successive signal samples, as shown in the following. This also will enable the hardware and memory requirements for performing the processing to be reduced. Specifically, equations (5), (6) can be expressed as respective time-axis functions by the following equations (7), (8):

$$h_k(n) = 2p_L(n)\cos\left[(2k+1)\frac{\pi}{2M}\left(n - \frac{k_d}{2}\right) - (2k+1)\frac{\pi}{4}\right] \quad (7)$$

$$f_k(n) = 2p_L(n)\cos\left[(2k+1)\frac{\pi}{2M}\left(n - \frac{k_d}{2}\right) + (2k+1)\frac{\pi}{4}\right] \quad (8)$$

In the above, k is a band index, i.e., taking values $0, 1, \ldots, M-1$, $h_k(n)$ is the impulse response of the band-separating filter for the k-th sub-band, $f_k(n)$ is the impulse response of the band-combining filter for the k-th sub-band, $p_L(n)$ is the impulse response of each prototype filter, and $k_d$ is the group delay measured from input to output of the band-separating filter bank or band-combining filter bank.

The manner of achieving high-speed processing will be described only for the case of band-separating operation. The band-separating processing can be expressed by the following equation (9):

$$x_k(r) = \sum_{n=0}^{N-1} h_k(n) x(rM - n) \quad (9)$$

In the above, $x_k(r)$ is the output sub-band signal which results from filtering and decimation of the k-th band, with r expressing respective time-axis positions of the signal samples, N is the number of taps of the filter for the k-th band, and x(n) is the input signal to the band-separating filter bank, i.e., with n expressing the respective time-axis positions of the input signal samples.

Designating $n = 2M\gamma + \rho$, and inserting the resultant form of equation (7) into equation (9), the following equation (10) can be obtained:

$$x_k(r) = \sum_{\rho=0}^{2M-1} \sum_{\gamma=0}^{\frac{N}{2M}-1} \cos\left[(2j+1)\frac{\pi}{2M}\left(2M\gamma + \rho - \frac{k_d}{2} - \frac{M}{2}\right)\right] \cdot$$
$$2p_L(2M\gamma + \rho) \cdot x(Mr - 2M\gamma - \rho) \quad (10)$$

Furthermore, designating the cos term in equation (10) as A, and developing that term A, the following equation (11) can be obtained:

$$A = \cos\left[(2k+1)\frac{\pi}{2M}\left(\rho - \frac{M}{2} - \frac{k_d}{2}\right)\right] \cdot \cos[(2k+1)\pi\gamma] \quad (11)$$

In equation (11), the portion cos(2k+1)πγ takes the value +1 when γ is even −1 when γ is odd. As a result, equation (10) can be rewritten as follows, as equation (12):

$$x_k(r) = \sum_{\rho=0}^{2M-1}\left[\begin{array}{c}\cos\left[(2k+1)\frac{\pi}{2M} - \left(\rho - \frac{M}{2} - \frac{k_d}{2}\right)\right] \cdot \\ \sum_{\gamma=0}^{\frac{N}{2M}-1}(-1)^\gamma \cdot 2 \cdot p_L(2M\gamma + \rho) \cdot x(Mr - 2M\gamma - \rho)\end{array}\right] \quad (12)$$

Use of equation (12) as the algorithm for deriving each of the sub-band signals from the input digital signal x(n) enables the band-separation processing to be performed efficiently. A similar algorithm can be utilized for operating on each of the sub-band signals which are to be combined, in the band-combining processing.

Third Embodiment

Figure 5:
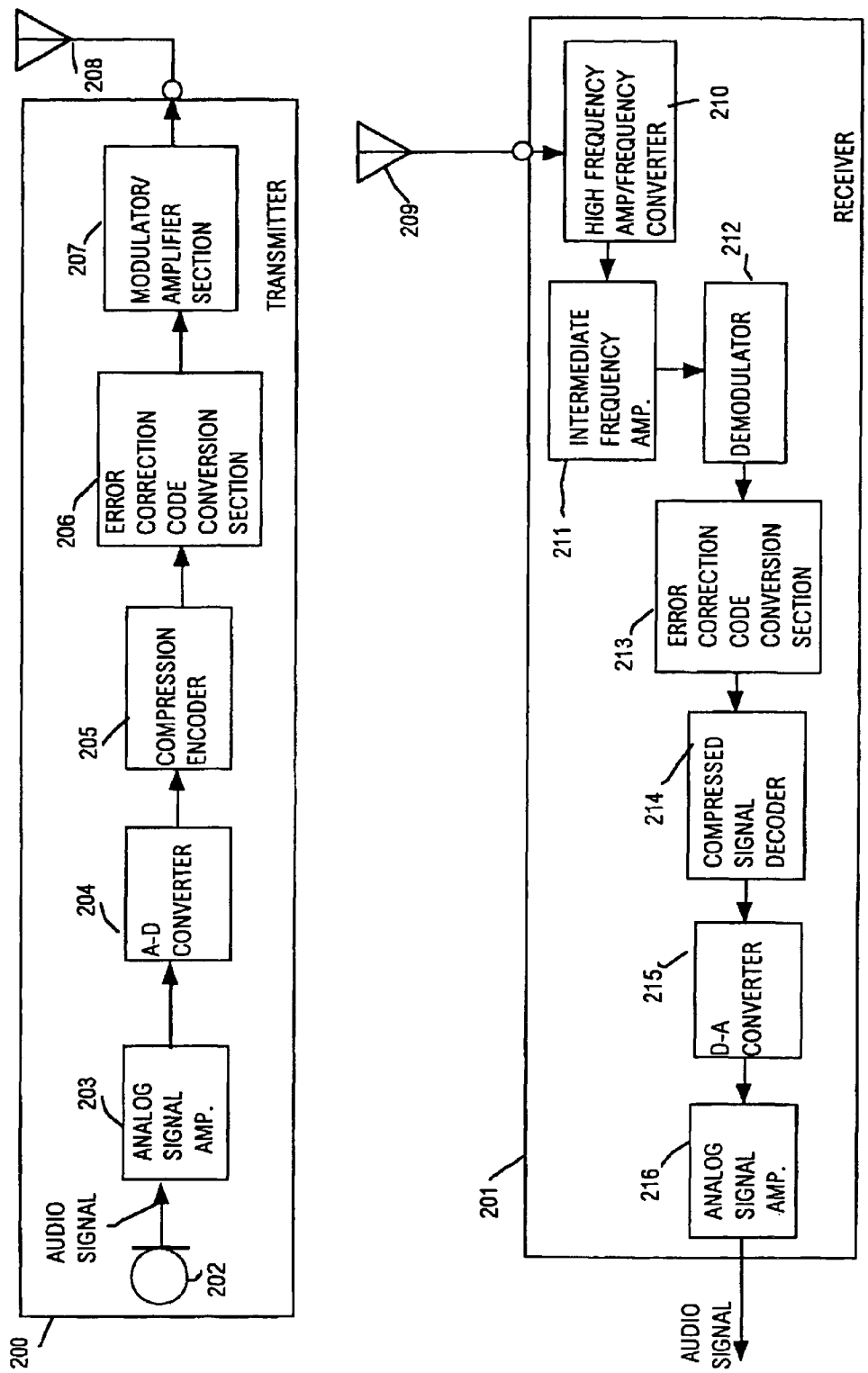
FIG. 5 is a general system block diagram of an embodiment of a wireless microphone transmitter system, having a PCM digital audio signal encoder apparatus and decoder apparatus, utilizing a sub-band separating apparatus and sub-band combining apparatus according to the invention.

FIG. 5 shows the system configuration of a third embodiment of the invention. This is a wireless microphone system which uses sub-band compression encoding/decoding processing having a low amount of delay, implemented as described above for the second embodiment. As a result with this system, by comparison with the prior art, there is a reduced amount of delay between the time at which a sound is received by a microphone of the system and the time at which a corresponding amplified sound is emitted from a loudspeaker.

In FIG. a transmitter 200 applies A-D conversion to convert an audio signal from a microphone into a PCM digital audio signal, then applies compression encoding processing as described hereinabove for the second embodiment of the invention, to obtain a compressed bit stream. The bit stream is then subjected to encoding conversion to reduce the effects of errors which may arise when the bit stream traverses a transmission path, and the resultant signal is then applied in digital modulation to obtain a high-frequency modulated signal which is transmitted as radio waves. The transmitter 200 is made up of a microphone 202, an analog signal amplifier 203, an A-D converter 204, a compression encoder 205, a code conversion/interleaving/error correction circuit 206, a modulator/amplifier circuit 207 and a transmitting antenna 208. The compression encoder 205 is is configured in accordance with the second embodiment of the invention.

A receiver 201 receives the radio waves which are transmitted from the transmitter 200, amplifies the resultant signal and applies frequency conversion and demodulation. The resultant demodulated signal is then subjected to transmission path error correction processing, and the resultant encoded compressed signal is decoded to obtain a digital output signal. That digital output signal is then subjected to digital-analog conversion to obtain an analog output audio signal, which can be supplied to drive a transducer such as a loudspeaker (not shown in the drawing). The receiver 201 is made up of a receiving antenna 209, a high-frequency amplifier/frequency converter 210 coupled to receive a high-frequency signal from the antenna 209, an intermediate-frequency amplifier 211, a demodulator 212, a code conversion/de-interleaving/error correction circuit 213, a compressed signal decoder 214, a D-A converter 215 and a analog signal amplifier 216. The compressed signal decoder 214 is configured in accordance with the second embodiment of the invention.

The operation of this digital wireless microphone system is as follows. Firstly, sound waves which reach the microphone 202 are converted to an analog audio signal which is amplified to an appropriate level by the analog signal amplifier 203, and the resultant signal is converted to a PCM digital audio signal by the A-D converter 204. In the compression encoder 205, the PCM digital audio signal is subjected to compression encoding with a low amount of delay, then encoding conversion is applied to reduce the effects of errors arising in the transmission path, by the error correction code conversion circuit 206, to obtain the final encoded data stream. Various schemes for processing data prior to transmission so that transmission errors can be automatically corrected in the receiving process, such as BCH encoding, interleaving, etc., which could by utilized for the operation of the error correction code conversion circuit 206.

The resultant encoded data stream is sent to the modulator/amplifier circuit 207, in which it is applied in digital quadrature modulation such as π/4-DQPSK (direct quadrature phase shift keying) modulation, to be converted to a modulated RF signal. This is then amplified to a sufficient level by an amplifier, and supplied to the transmitting antenna 208 to be transmitted as radio waves.

In the receiver 201, the radio waves are received by the receiving antenna 209, the resultant signal is amplified by the high-frequency amplifier/frequency converter 210, and converted to an intermediate-frequency signal by the high-frequency amplifier/frequency converter 210, then is amplified by intermediate-frequency (IF) amplifier 211 to a sufficiently high level for performing demodulation. The resultant IF signal is then demodulated by the demodulator 212. The demodulated signal is subjected to error correction processing to eliminate code errors which may have arisen in the transmission path, by the error correction code conversion section 213, to obtain an error-corrected signal. The compressed signal decoder 214 then applies low-delay decoding, to recover an original set of sub-band signals, and additive combination of these sub-band signals to recover the original PCM digital audio signal.

In some cases it may be possible for the receiving apparatus to directly output only that recovered PCM digital audio signal. However since it may be necessary to drive an analog type of amplifier apparatus such as a high-power audio amplifier, it is preferable to perform D-A conversion so that an analog output signal can also be provided. With this embodiment the PCM digital audio is converted to an analog audio signal by the D-A converter 215, which is then amplified by the analog signal amplifier 216 to obtain an output analog audio signal.

With this embodiment of the invention, a band-separating filter bank and band-combining filter bank each having a low amount of filtering delay are utilized, in a digital signal compression encoding/decoding apparatus. As a result it is possible to implement a digital type of wireless microphone system which enables sounds to be produced in amplified form from a loudspeaker with a minimum of delay between reception of the sounds by a microphone and emission of the sounds from the loudspeaker.

Furthermore, when compression encoding is performed using digital modulation, frequency can be effectively utilized, so that it becomes possible to simultaneously use a plurality of wireless microphones.

Fourth Embodiment

Figure 6:
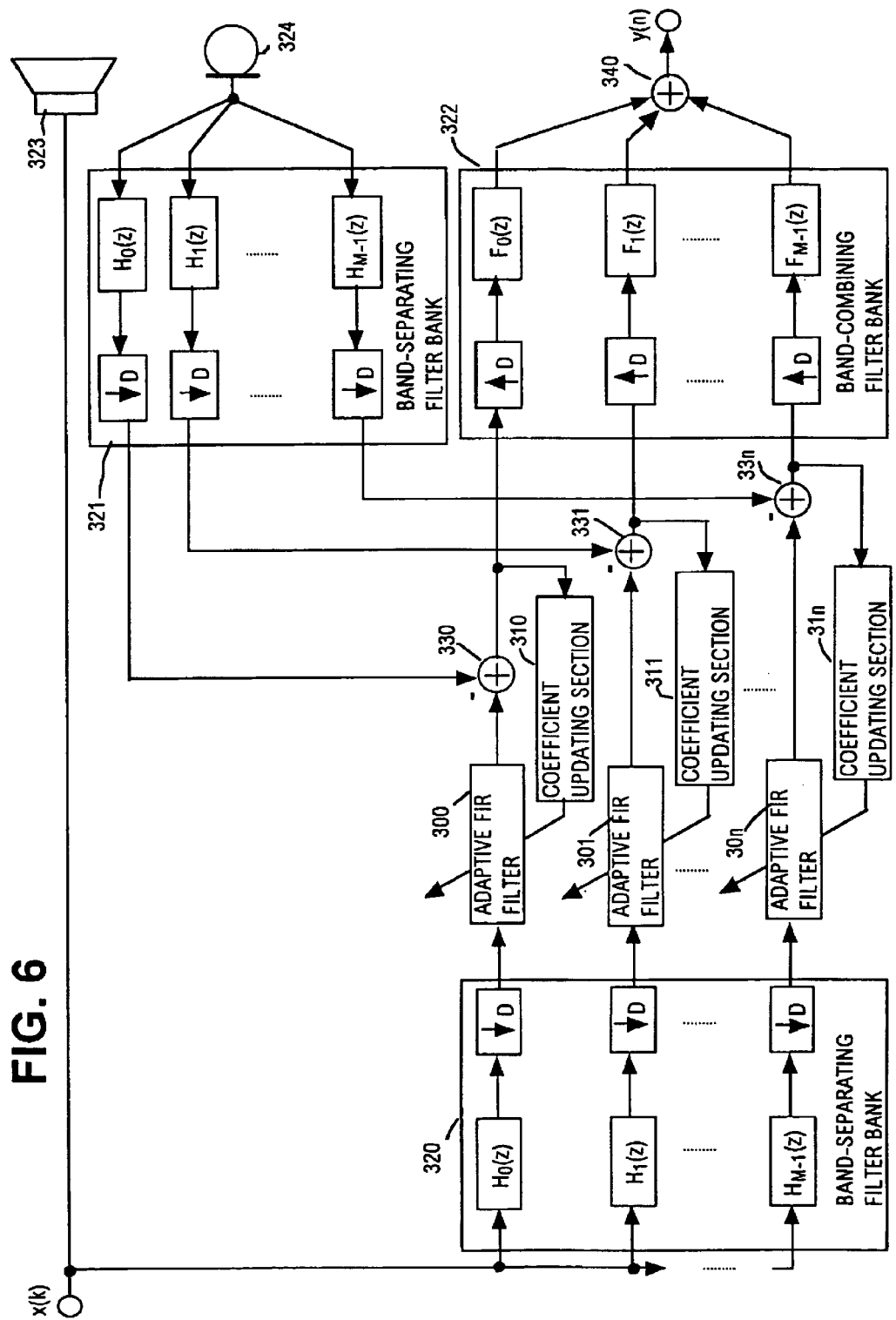
FIG. 6 is a general system block diagram of an embodiment of an echo canceller apparatus which utilizes sub-band separating apparatuses and a sub-band combining apparatus according to the invention.
Figure 7:
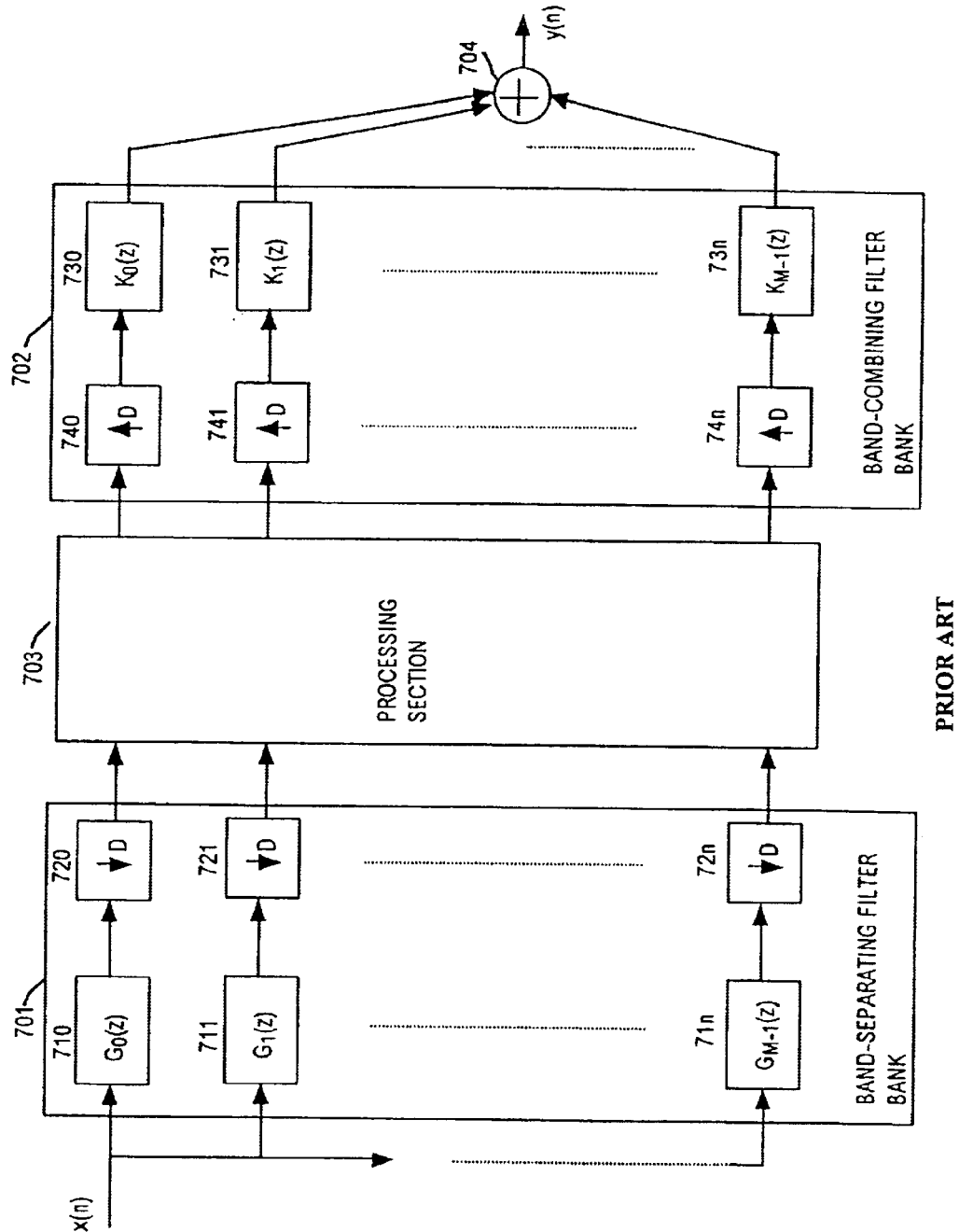
FIG. 7 is a general system block diagram of an example of a prior art sub-band separating apparatus and sub-band combining apparatus.

FIG. 6 shows the configuration of an echo canceller which uses sub-band separating/combining processing in accordance with the first embodiment of the invention described above. For the purpose of description, it is assumed that the apparatus shown in FIG. 6 receives an input digital audio signal x(k) which is transmitted from a distant location (referred to in the following as the far-end location) as a result of speech sound waves that are produced by an individual (referred to in the following as the far-end individual) entering a microphone, with the resultant audio signal being converted to the digital audio signal x(k) and transmitted via some form of communication link. The location of the apparatus shown in FIG. 6 will be referred to as the near-end location, and will be assumed to be an enclosed room. In FIG. 6, numeral 323 denotes a combination of a D/A converter for converting the digital audio signal x(k) to analog form, a loudspeaker, and an audio amplifier which amplifies the analog audio signal to drive the loudspeaker, however for brevity of description that combination will be referred to simply as the loudspeaker 323. Also in FIG. 6, numeral 324 denotes a combination of a microphone and an A/D converter for converting an analog audio signal from the microphone to a digital audio signal, with that combination being referred to in the following simply as the microphone 324. The purpose of the microphone 324 is to enable an individual at the near-end location to communicate with the far-end individual, however for the purpose of the following description, only those sounds which reach the microphone 324 from the loudspeaker 323 will be considered.

The objective of the echo canceller is to prevent sound waves which are emitted from the loudspeaker 323 as a result of the input digital audio signal x(k) and enter the microphone 324 (in accordance with a transfer function of the room at the far-end location, with respect to transmission of sound waves from the loudspeaker 323 to the microphone 324) from being transmitted back to the far-end individual in delayed form, as echoes. Basically, the echo canceller estimates the transfer function of the far-end location, and controls a set of adaptive filters accordingly such as to cancel any audio signal components from the microphone 324 that result from the audio signal being applied to the loudspeaker 323.

The echo canceller apparatus is formed of a first band-separating filter bank 320, whose configuration and operation are as described hereinabove for the band-separating filter bank 1 of the first embodiment, a set of adaptive FIR filters 300~30n which respectively receive the decimated sub-band signals produced from the band-separating filter bank 320, a set of coefficient updating sections 310~31n each of which operates on a corresponding one of the adaptive FIR filters 300~30n to adjust the tap coefficients of that corresponding filter, a set of adders 330~33n whose respective outputs are supplied to corresponding ones of the coefficient updating sections 310~31n and which each receives at a first input thereof an output signal produced from a corresponding one of the adaptive FIR filters 300~30n, a second band-separating filter bank 321, whose operation and configuration are also in accordance with the band-separating filter bank 1 of the first embodiment and which receives the aforementioned digital audio signal produced from the microphone 324 and inputs each of the resulting decimated sub-band signals to a subtraction input of a corresponding one of the adders 330~321, a band-combining filter bank 322 whose operation and configuration are in accordance with the band-combining filter bank 2 of the first embodiment and which receives respectively outputs produced from the adders 330~321, and an adder 340 which additively combines the interpolated sub-band signals which are produced from the band-combining filter bank 322 to obtain a digital audio output signal y(n), to be transmitted back to the far-end location via a communication link.

Each of the band-separating filter banks 320 and 321 and the band-combining filter bank 322 is configured with a prototype filter which is a FIR low-pass filter having an asymmetric impulse response, with each of the band-separating filter banks 320, 321 being a DFT filter bank which is formed in accordance with equation (5) above and with the band-combining filter bank 322 being a DFT filter bank which is formed in accordance with equation (6) above.

The operation of this echo canceller apparatus is as follows. The input audio signal which is sent from the far-end individual passes over a transmission path and arrives as the digital audio signal x(k) which is supplied to the band-separating filter bank 320 and to the loudspeaker 323. In the band-separating filter bank 320, the input signal is subjected to convolution processing in respective frequency bands by the band filters, and the resultant signals are subjected to decimation processing by a decimation factor D which is no greater than the separation factor M, as described for the first embodiment. The resultant down-sampled sub-band samples are inputted to the adders 330~33n. Sound waves which are emitted by the loudspeaker 323 are received by the microphone 324, and the resultant audio signal is inputted to the band-separating filter bank 321.

In the band-separating filter bank 321, the input signal is subjected to convolution processing in respective frequency bands by the band filters, and the resultant sub-band signals are subjected to decimation processing by a decimation factor D which is no greater than the separation factor M, as described for the first embodiment. The resultant down-sampled sub-band signals are inputted to respectively corresponding ones of the adaptive FIR filters 300~30n. The resultant output signal from each of the adaptive FIR filters 300~30n has the corresponding one of the sub-band signals from the band-separating filter bank 320 subtracted therefrom, in the corresponding one of the adders 330~33n, to thereby obtain an error signal. These error signals are inputted to respectively corresponding ones of the coefficient updating sections 310~31n, and also inputted to respectively corresponding ones of the up-converters of the band-combining filter bank 322. Thus, the signal y(n) which is obtained from the band-combining filter bank 322 will be reduced in amplitude in accordance with reduction of the error signals.

A known type of coefficient updating algorithm such as the NLMS algorithm can be utilized for the operation of each of the coefficient updating sections 310~31n. Such an algorithm is of a type whereby, at each sample time point of the input digital signal to a FIR filter, the coefficients of the filter are updated by adding thereto an updating amount, which is determined in accordance with a preceding history of errors between the actual output values produced from the filter and respective ideal values which would be produced by an ideal FIR filter. With a LMS (least mean-square) type of adaptive algorithm, only the error resulting from the immediately preceding digital signal input to the filter is utilized, in general, with the updating being successively performed starting from an initial assumed set of coefficients (e.g., all zero). The coefficients of a filter are processed as a vector quantity, as are each of the digital signal values.

Basically, designating successive input signal sample time points as 0,1, ... k, (k+), and the corresponding values of the sets of coefficients of a filter as the vectors w(0), w(1) ... w(k), w(k+1), ..., e.g., with w(0) being predetermined as zero, and designating as δw(k) an updating amount, each of successive coefficient values w(k+1) are obtained as:

$$w(k+1)=w(k)+\mu.\delta w(k) \quad (13)$$

Here, $\mu$ is an adaptation constant, generally referred to as the step size, which controls the size of the updating amount, at each update. The updating amount δw(k) is derived based on an amount of error between the preceding output value w(k) from the filter and the output which would have been produced from an ideal filter, which can be considered as being identical to the value of the target signal at that time (i.e., with this embodiment, the output value of the corresponding one of the sub-band signals from the sub-band separating filter bank 321 at that time).

With the NLMS (normalized least mean-square) method, the step size is normalized, i.e., is automatically adjusted based on the power of the input signal to the filter. Typically, the NLMS algorithm may be expressed as follows:

$$W(k+1)=w(k)+(\alpha/(x(k)^T x(k)+\beta))e(k)x(k) \quad (14)$$

Here, $\alpha$ determines the maximum step size (0<α<2), $\beta$ is a small-magnitude value for the purpose of preventing division by zero, x(k) is the (preceding) input signal value to the filter, e(k) is the aforementioned error amount between the target signal and the signal resulting from the adaptive filtering of the preceding input signal value, and superscript T denotes the transposed matrix.

With this embodiment, the sub-band signals of respective frequency bands which are produced from the band-separating filter bank 320 are subjected to convolution processing by respectively corresponding ones of the adaptive filters 300~30n, with updating of the filter coefficients being performed for each of these by the corresponding one of the coefficient updating sections 31n as described above, and the resultant error signals respectively corresponding to these filtered sub-band signals from the adaptive filters, obtained from the adders 330~33n, are inputted to the band-combining filter bank 322. In the band-combining filter bank 322, these signals are subjected to interpolation processing, using the same interpolation factor D as the factor M used for band separation, and convolution with the band-combining filters is then applied for the respective frequency bands.

The additive combination of the resultant signals is then obtained by the adder 340, as the digital audio signal y(n), which is the output signal from the echo canceller. That signal is transmitted over a communication link to the far-end individual.

With this embodiment, due to the fact that each of the filter banks is configured to utilize a FIR low-pass filters having an asymmetric impulse response as the prototype filter, thereby achieving a lower amount of group delay for each of the filter banks than is possible in the prior art, it is found that greater effectiveness can be achieved in suppressing a spurious digital audio signal that may be produced as a component of the output signal y(n) due to sound waves from the loudspeaker 323 reaching the microphone 324, and thereby returned to the far-end individual. Hence, greater effectiveness in echo suppression can be achieved than is possible in the prior art.

It should be noted that although the invention has been described in the above referring to specific embodiments, it should be understood that various modifications to the described embodiments could be envisaged, which fall within the scope claimed for the invention in the appended claims.

What is claimed is:

1. An echo canceller apparatus comprising:
   loudspeaker means for audibly reproducing a first input digital audio signal which is transmitted from a remote location;
   microphone means for generating a second input digital audio signal in response to incident sound waves;
   first sub-band separating means for converting said first input digital audio signal to a first plurality of sub-band signals;
   second sub-band separating means for converting said second input digital audio signal to a second plurality of sub-band signals;
   a plurality of adaptive filters for controllably filtering said first plurality of sub-band signals to obtain corresponding modified sub-band signals;
   means for deriving respective differences between said modified sub-band signals and corresponding ones of said second sub-band signals, as respective error signals;
   filter coefficient updating means for utilizing values of said error signals to modify filter coefficients of respective ones of said adaptive filters; and
   sub-band combining means for combining said error signals into a single digital audio signal, to be transmitted to said remote location, wherein;
   each of said first and second sub-band separating means comprises a digital signal sub-band separating apparatus including:
      a plurality of filters corresponding to respective frequency bands, for separating said input digital audio signal into said plurality of sub-band signals; and
      decimation means for applying digital signal sample decimation to each of said sub-band signals, wherein;
      said digital signal sub-band separating apparatus comprises, as a prototype filter of said plurality of filters, a FIR (finite impulse response) low-pass filter which is configured to have an asymmetric impulse response.

2. An echo canceller apparatus comprising:
   loudspeaker means for audibly reproducing a first input digital audio signal which is transmitted from a remote location;
   microphone means for generating a second input digital audio signal in response to incident sound waves;
   first sub-band separating means for converting said first input digital audio signal to a first plurality of sub-band signals;
   second sub-band separating means for converting said second input digital audio signal to a second plurality of sub-band signals;
   a plurality of adaptive filters for controllably filtering said first plurality of sub-band signals to obtain corresponding modified sub-band signals;
   means for deriving respective differences between said modified sub-band signals and corresponding ones of said second sub-band signals, as respective error signals;

filter coefficient updating means for utilizing values of said error signals to modify filter coefficients of respective ones of said adaptive filters; and sub-band combining means for combining said error signals into a single digital audio signal, to be transmitted to said remote location, wherein;

said sub-band combining means comprises a digital signal sub-band combining apparatus including:

a plurality of filters corresponding to respective frequency bands, for filtering corresponding ones of said plurality of error signals supplied thereto and outputting a plurality of filtered output signals;

interpolation means for applying digital signal sample interpolation to corresponding ones of said plurality of filtered output signals; and means for additively combining respective outputs of said interpolation means to form said single digital audio signal, wherein;

said apparatus comprises, as a prototype filter of said plurality of filters, a FIR (finite impulse response) low-pass filter which is configured to have an asymmetric impulse response.

* * * * *